United States Patent
Barrett et al.

(10) Patent No.: US 12,248,033 B2
(45) Date of Patent: Mar. 11, 2025

(54) SUBSEA CONNECTOR

(71) Applicant: Siemens Energy Global GmbH & Co. KG, Bayern (DE)

(72) Inventors: Wesley Barrett, Kendal (GB);
Cameron Brennan, Ulverston (GB);
Christopher Burrow, Ulverston (GB);
Jonathan Hardisty, Ulverston (GB);
Peter Henry, Milnthorpe (GB)

(73) Assignee: Siemens Energy Global GmbH & Co. KG, Bayern (DE)

( * ) Notice: Subject to any disclaimer, the term of this patent is extended or adjusted under 35 U.S.C. 154(b) by 346 days.

(21) Appl. No.: 17/782,647

(22) PCT Filed: Dec. 10, 2020

(86) PCT No.: PCT/EP2020/085603
§ 371 (c)(1),
(2) Date: Jun. 4, 2022

(87) PCT Pub. No.: WO2021/116323
PCT Pub. Date: Jun. 17, 2021

(65) Prior Publication Data
US 2023/0009735 A1 Jan. 12, 2023

(30) Foreign Application Priority Data
Dec. 12, 2019 (GB) .................................. 1918323

(51) Int. Cl.
*G01R 31/66* (2020.01)
*G01L 1/22* (2006.01)
(Continued)

(52) U.S. Cl.
CPC .............. *G01R 31/66* (2020.01); *G01L 1/22* (2013.01); *G01P 15/00* (2013.01); *H01R 13/6683* (2013.01)

(58) Field of Classification Search
CPC .......... G01R 31/66; G01L 1/22; G01P 15/00; H01R 13/6683; E21B 33/0355; E21B 33/038
See application file for complete search history.

(56) References Cited

U.S. PATENT DOCUMENTS

| | | | |
|---|---|---|---|
| 8,353,350 B2 * | 1/2013 | Overfield | E21B 47/001 166/344 |
| 10,788,543 B2 * | 9/2020 | Emerich | G01R 31/69 |

(Continued)

FOREIGN PATENT DOCUMENTS

| | | |
|---|---|---|
| AU | 7171900 A | 6/2001 |
| CN | 201027516 Y | 2/2008 |

(Continued)

OTHER PUBLICATIONS

International search report and written opinion dated Apr. 13, 2021 for corresponding PCT/EP2020/085603.

*Primary Examiner* — Xin Y Zhong
(74) *Attorney, Agent, or Firm* — Wolter Van Dyke Davis, PLLC

(57) ABSTRACT

An independently mountable sensor system for a wet-mateable subsea connector or a dry-mateable subsea connector having at least one of a receptacle connector body or a plug connector body with a pressure vessel; one or more sensors, a power source, a transmitter, a processor and a memory within the pressure vessel. The pressure inside the pressure vessel is maintained at a predetermined pressure and an antenna is provided in the sensor system. The pressure vessel includes an electromagnetically transparent section to permit electromagnetic waves to pass between the sensor system and an external receiver. The sensor system is configured to be mounted between a back end and a front end of the receptacle connector body, or between a back end (Continued)

and a front end of the plug connector body; or configured to be mounted to the connector body back end.

25 Claims, 11 Drawing Sheets

(51) Int. Cl.
*G01P 15/00* (2006.01)
*H01R 13/66* (2006.01)

(56) References Cited

U.S. PATENT DOCUMENTS

| | | |
|---|---|---|
| 2006/0189208 A1 | 8/2006 | Shaikh |
| 2011/0000677 A1 | 1/2011 | Overfield |
| 2012/0037375 A1 | 2/2012 | Reynolds et al. |
| 2012/0273211 A1 | 11/2012 | Choudhury |
| 2014/0093247 A1 | 4/2014 | Jamtveit |
| 2014/0199775 A1 | 7/2014 | Bagley |
| 2014/0374132 A1 | 12/2014 | Boe |
| 2015/0094866 A1 | 4/2015 | Pereira |
| 2017/0003455 A1 | 1/2017 | Cairns |
| 2017/0030160 A1 | 2/2017 | Gray |
| 2017/0359128 A1 | 12/2017 | Xi et al. |
| 2018/0076573 A1 | 3/2018 | Walton |
| 2019/0136486 A1 | 5/2019 | Berque |

FOREIGN PATENT DOCUMENTS

| | | |
|---|---|---|
| CN | 101238617 A | 8/2008 |
| CN | 104333891 A | 2/2015 |
| CN | 108092061 A | 5/2018 |
| CN | 207556743 U | 6/2018 |
| CN | 108352653 A | 7/2018 |
| EP | 2383427 A2 | 11/2011 |
| EP | 2265793 B1 | 8/2012 |
| EP | 3193148 A1 | 7/2017 |
| EP | 3269921 A1 | 1/2018 |
| EP | 3511517 A1 | 7/2019 |
| GB | 2477714 A | 8/2011 |
| RU | 136246 U1 | 12/2013 |
| WO | 0140837 A2 | 6/2001 |
| WO | 2012007407 A2 | 1/2012 |
| WO | 2016022272 A1 | 2/2016 |
| WO | 2016146989 A1 | 9/2016 |
| WO | 2017086931 A1 | 5/2017 |
| WO | 2017102034 A1 | 6/2017 |
| WO | 2019166789 A1 | 9/2019 |

* cited by examiner

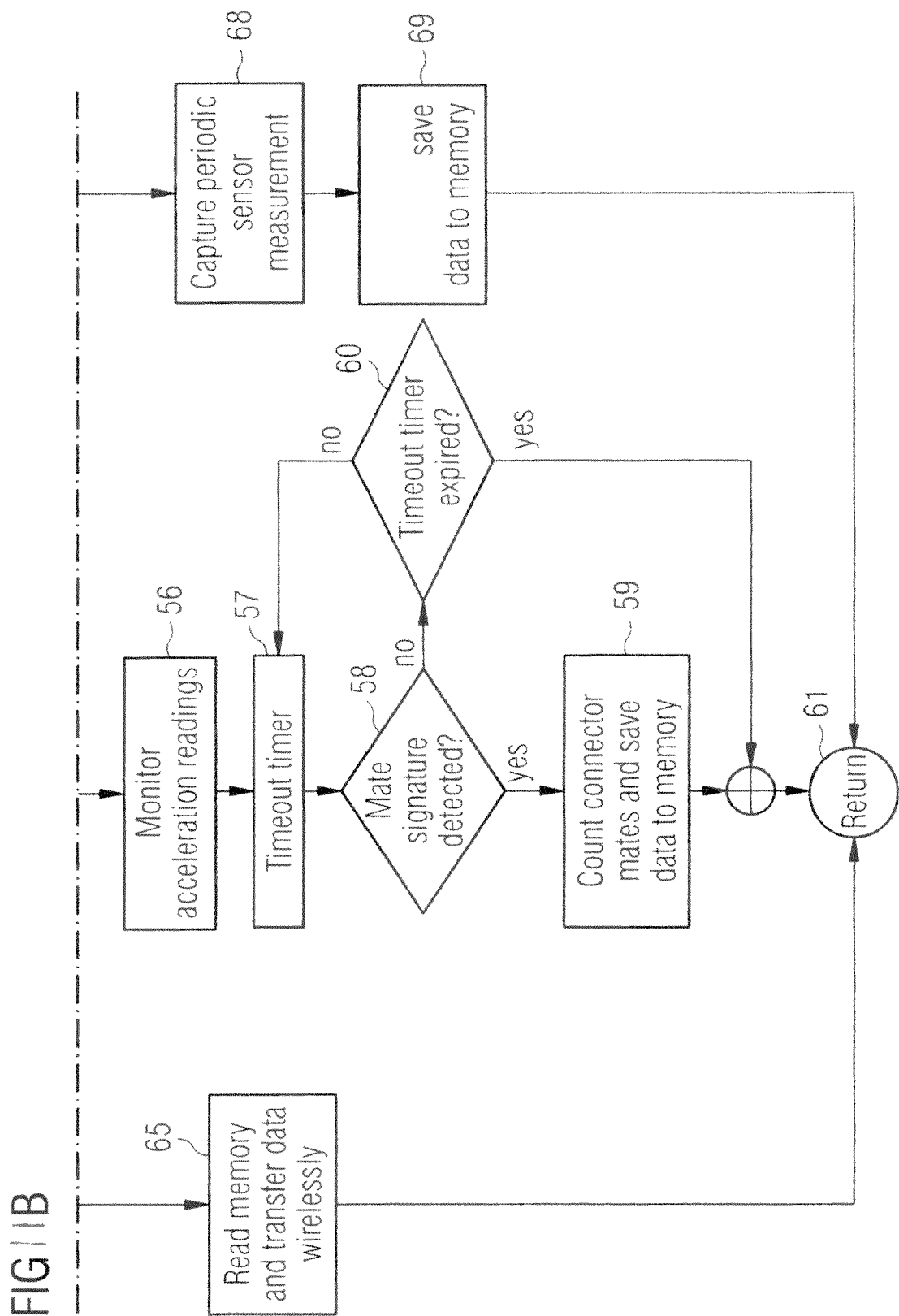

SUBSEA CONNECTOR

CROSS REFERENCE TO RELATED APPLICATIONS

This application is the US National Stage of International Application No. PCT/EP2020/085603 filed 10 Dec. 2020, and claims the benefit thereof. The International Application claims the benefit of United Kingdom Application No. GB 1918323.5 filed 12 Dec. 2019. All of the applications are incorporated by reference herein in their entirety.

FIELD OF INVENTION

This invention relates to a subsea, or underwater, connector including a sensor system and a method of operating the system and connector.

BACKGROUND OF INVENTION

Subsea, or underwater, connectors are designed to operate beneath the surface of the water. Typically, a subsea connector comprises two parts, generally known as plug and receptacle. The receptacle may include one or more conductor pins and the plug may include corresponding plug sockets for the receptacle conductor pins. The connection may be made topside (dry-mate), or subsea (wet-mate) and the specific design is adapted according to whether the connector is a wet-mate or dry-mate connector. Subsea connectors have various applications including power connectors which supply power to subsea equipment such as electrical submersible pumps, or control and instrumentation connectors which exchange data between different pieces of subsea equipment, or between subsea equipment and topside devices.

After installation subsea, maintenance of connectors is expensive and difficult to carry out requiring a support vessel, with an ROV or diver to replace faulty connectors. This may be addressed by replacement before the end of the expected lifetime of the connector, for example, at fixed time intervals, during other scheduled maintenance events to save costs on vessels. However, this increases capital costs for the operator, as the connectors are replaced more often than absolutely necessary and can also incur downtime of their subsea application. An alternative solution is desirable.

SUMMARY OF INVENTION

In accordance with a first aspect of the present invention an independently mountable sensor system for a wet-mateable subsea connector or a dry-mateable subsea connector comprising at least one of a receptacle connector body or a plug connector body; the sensor system comprising a pressure vessel; one or more sensors, a power source, a transmitter, a processor unit and a memory within the pressure vessel, wherein the pressure inside the pressure vessel is maintained at a predetermined pressure; wherein the sensor system further comprises an antenna; wherein the pressure vessel comprises an electromagnetically transparent section to permit electromagnetic waves to pass between the sensor system and an external receiver; wherein the sensor system is configured to be mounted between a back end and a front end of the receptacle connector body, or between a back end and a front end of the plug connector body; or configured to be mounted to the connector body back end.

The electromagnetic waves allow data to be transferred by the processor from the memory to an external device via the antenna, so that the state of the connector can be monitored without needing to open up or disconnect the connector. The antenna is typically inside the pressure vessel, for example as a trace on a PCB of control electronics, although in some circumstances, an antenna may be provided outside the pressure vessel In one embodiment, the sensor system is mounted directly between the back of the front end of the connector body and the front of the back end of the connector body, effectively extending the length of the connector housing, or alternatively the sensor system is configured to be mounted to an opening in the housing between the back end and the front end of the plug connector body, or receptacle connector body, or between the back of the back end of the connector.

Providing the complete sensor system within a pressure vessel allows standard electronic components to be used, removing the requirement for use of pressure tolerant electronics that must withstand subsea external pressures up to 450 Bar (45000 Pa). Wireless transmission to extract data avoids the need for penetrations in the pressure vessel which might compromise integrity and introduce design complexity.

The predetermined pressure may be a substantially constant pressure.

By keeping the pressure inside the pressure vessel at a constant pressure, the components do not suffer any ill effects from pressure changes between their being manufactured topside and deployed subsea. The pressure inside the pressure vessel may be kept as close as possible to atmospheric pressure to protect the electronic and other components with internal chambers or voids from the effects of the significantly higher pressures experienced subsea without a pressure vessel.

The pressure within the pressure vessel may be within the range of 940 mBar (94000 Pa) to 1050 mBar (105000 Pa).

The sensor system may further comprise a receiver, in particular, wherein the transmitter and receiver are combined in a transceiver unit.

In some embodiments, the sensors automatically transmit data whenever a receiver is within range and so a receiver is not required within the sensor system, but having the full transmitter and receiver function within the sensor system allows selective data extraction.

The sensor system may further comprise a control device, in particular a microcontroller unit.

This provides a CPU functionality.

The pressure vessel may comprise a metal housing into which the electromagnetically transparent section is integrated.

The electromagnetically transparent section comprises glass, ceramic or plastic.

The plastic is typically a high performance polymer, such as PEEK, or polycarbonate, as the section has to withstand high differential pressures subsea.

The one or more sensors comprise at least one of a strain gauge, an accelerometer, a temperature sensor and a Hall effect sensor, or magnetometer sensor.

The strain gauge may be mounted to an internal surface of the pressure vessel, the outer surface of which is in contact with an oil filled cavity of the connector or hose.

The sensor system may further comprise a signal conditioning module to amplify strain gauge measurements.

The power source may comprise a battery, in particular, a rechargeable battery.

An electromagnetic induction, or energy harvesting charger may be provided in the pressure vessel to charge the battery.

This allows higher power applications, such as a display, to be used with the sensor system.

The antenna may be mounted within the pressure vessel, but typically the sensor system comprises an external antenna mounted to an outer surface of the pressure vessel.

The sensor system may further comprise a display within the pressure vessel.

The transmitter may comprise a wireless transmitter transmitting in the frequency range of 3 kHz to 300 GHz.

In accordance with a second aspect of the present invention, a wet-mateable subsea connector or a dry mateable subsea connector comprises a housing body, a front end, a back end and a sensor system according to the first aspect, mounted within the housing body of the connector, or mounted to an opening in the housing body of the connector between the back end and the front end.

The sensor system may be mounted between the connector front end and a hose connection.

The connector housing may comprise a location mechanism to guide an external receiver to the electromagnetically transparent section.

The external receiver may comprise a camera to capture an image of the sensor system display.

In accordance with a third aspect of the present invention, a method of operating a sensor system according to the first aspect comprises operating the sensor system in a sleep or low power mode until a prompt occurs; on occurrence of the prompt, sending a wake-up signal to a processor unit of the sensor system; obtaining one or more predetermined measurements in response to the specific prompt detected; and saving the one or more measurements to the memory; or extracting one or more saved measurements from the memory and transmitting the measurements by means of electromagnetic saves through the electromagnetically transparent section to an external receiver.

The prompt event may comprise detecting, in an accelerometer in the sensor system, an acceleration signature representing a mate or demate.

The prompt event may comprise detecting a request from an external receiver to transfer to that receiver, saved data from the memory.

The prompt event may comprise expiry of a timer, indicating that one or more periodic measurements are required.

The embedded sensor system in the subsea connector allows the user to monitor operation of the connector and relate replacement and maintenance actions more closely to the condition of a specific connector, reducing capital costs to the operator.

BRIEF DESCRIPTION OF THE DRAWINGS

An example of a subsea sensor system for a subsea connector and associated method of operation in accordance with the present invention will now be described with reference to the accompanying drawings in which.

DETAILED DESCRIPTION OF INVENTION

Figure 1:
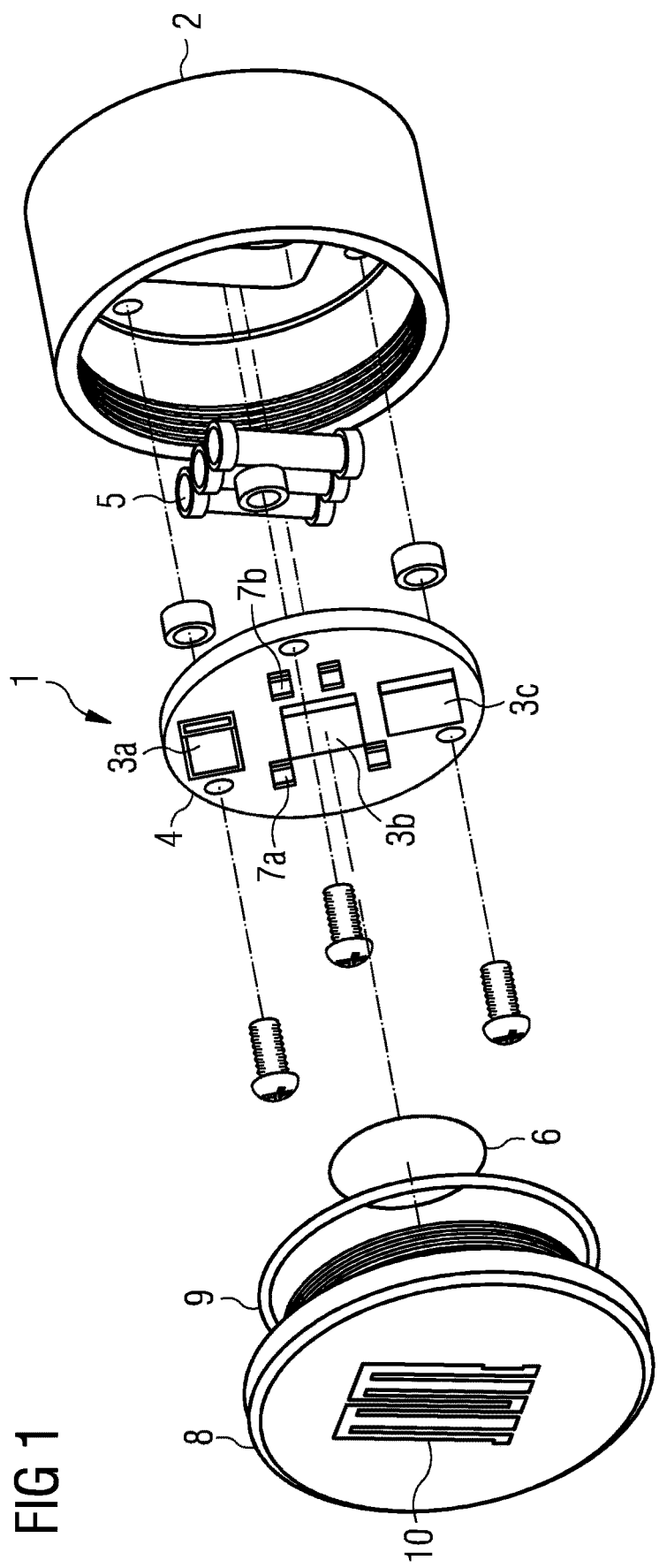
FIG. 1 illustrates an example of an embedded sensor system for a connector assembly of a subsea sensor system according to the invention, seen from a first perspective.

The drive to reduce overall lifecycle costs, both capital expenditure (CAPEX) and operational expenditure (OPEX), associated with new deep-water oil and gas developments means that improvements to existing designs, manufacturing processes and operation are desirable. Subsea connector systems that have a lower cost, can be relatively quickly and easily installed and that have reduced maintenance requirements, or need for intervention are desirable. Currently operators replace or refurbish subsea connectors during other manual subsea interventions due to the large associated cost involved with repair or replacement because of the subsea location. It is not uncommon for connectors to be replaced or refurbished well within their 30 years' design life. It is more cost effective for operators to replace or refurbish connectors during other, more expensive equipment interventions than to postpone connector replacements or refurbishments and to potentially incur expensive downtime of an offshore oil rig purely due to replacing lower value equipment (i.e. the connectors).

Various examples of use of sensors in connectors are known, for example, US20180076573 describes a method for determining an operational state of a subsea connector unit using a tan delta sensor to monitor the quality of the dielectric oil contained within a subsea connector unit for the purposes of providing a method to carry out condition-based monitoring. However, the question of how to extract the data that has been obtained has not been addressed. EP 2 265 793 B1 describes a subsea test apparatus including a wet mateable connector and measurement means which uses a self-contained measurement system within a subsea test or dummy connector for the purpose of testing the subsea, but this only allows for testing when that dummy connector is applied and requires a corresponding wet mateable connector to be provided, either by removing some other connection, or as an additional part of the subsea equipment. U.S. Pat. No. 9,820,017 describes a subsea connector with a data collection and communication system and method which uses a data collection or communication system located within a connector to monitor and record one or more connector performance parameters, then transmits them via system cables to topside, or uses a transponder outside the housing for wireless transmission. This requires good seals around the transponder cables to prevent leaks into the connector housing.

In an alternative application, for example, as described in EP3511517, control/data-processing electronics are housed in a pressure resistant chamber and a pressure sensing element is located outside that chamber, whereby the pressure sensing element is exposed to process fluid pressures and temperatures. Extracting data from the pressure sensor provided to the control electronics has been addressed by using inductive coupling between first coils located within the pressure resistant chamber and second coils across a pressure resistant barrier in an adjacent pressure compensated chamber. An AC current can be modulated and supplied to one coil to create a modulated magnetic field which then in turn induces a modulated current on the receiving coil from which it can then be demodulated Thereafter, the sensor data is transmitted via a cable. However, using magnetic field for the data transmission across the pressure barrier relies on close proximity and suitable alignment between the coils and also requires some degree of magnetic field control to achieve an adequate inductive coupling and so is not suitable for extracting data subsea where close proximity and alignment cannot be guaranteed between a transmitting and receiving element, for instance when the receiving element is free to move relative to the transmitting element.

The present invention provides a means of determining the operational health and usage of a connector to optimise subsea availability of the application for which the connector is required. In a connector assembly according to the invention, a sensor system may be provided in the form of a fully contained embedded sensor system, or a partially contained embedded sensor system. This sensor system is independently mountable in a connector body, or onto the connector body in various ways, without the need for any part of the connector to be modified. In this stand-alone form, the sensor system may be integrated, or retrofitted, at any region within a connector or harness assembly. Advantageously, the sensor system is connected between a front-end of the connector and a back-end, as described in more detail hereinafter. This means that the sensor system does not interfere with any of the existing product components and becomes a selectable add-on feature for users without needing to redesign the basic connector parts.

Figure 2:
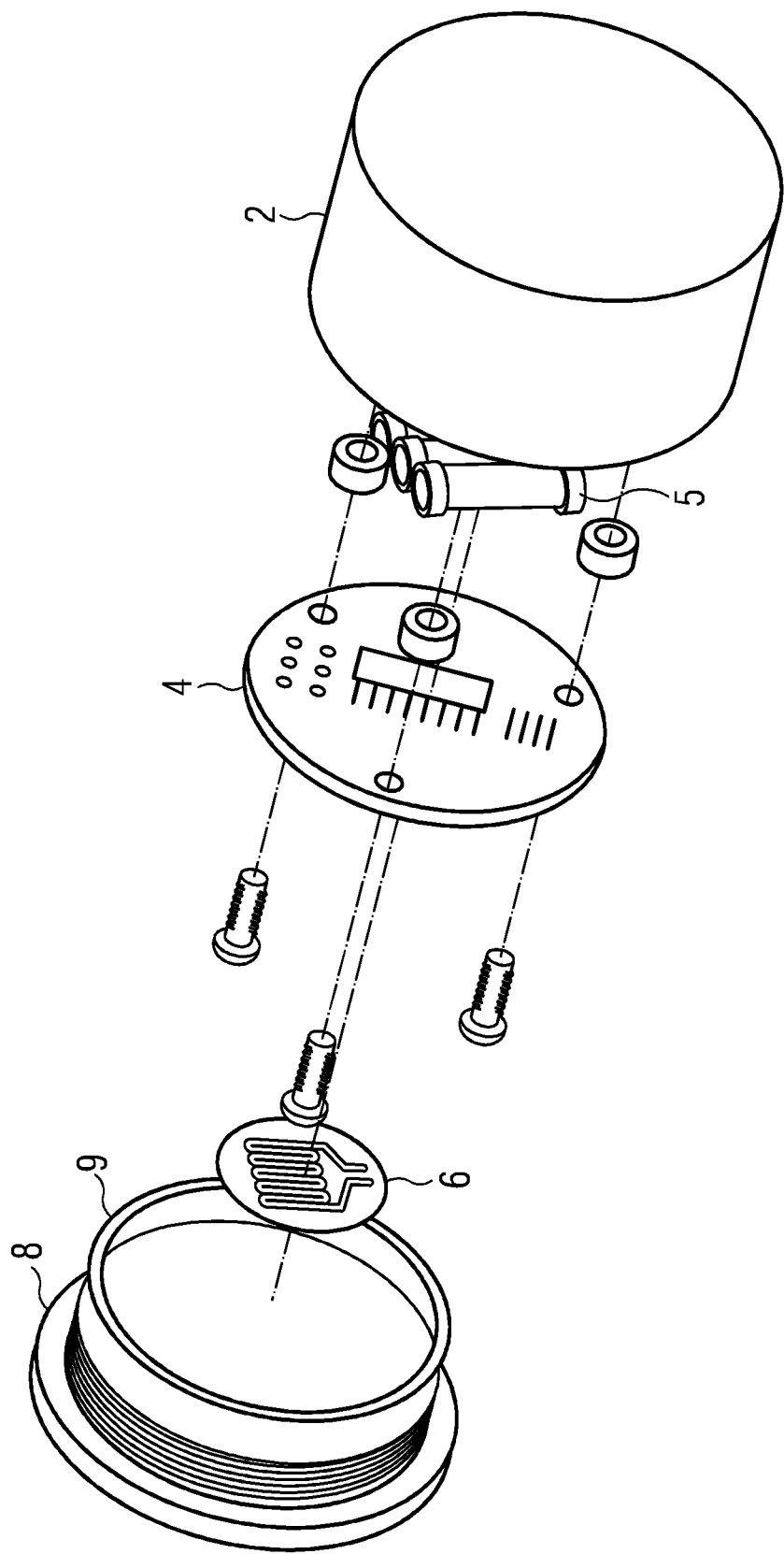
FIG. 2 illustrates the example of FIG. 1, seen from a second perspective.

The general features of an embedded sensor system for a subsea connector according to the present invention are illustrated in FIGS. 1 and 2. The sensor system comprises a pressure vessel 2 which houses electronic circuitry, for example, as shown, with electronic components 3a, 3b, 3c mounted on a printed circuit board (PCB) 4 or alternatively on a polyimide flexible PCB (not shown), the PCB being secured to the inside of the pressure vessel by a suitable method of fixing, such as screws, clamps or other types of connectors.

In some embodiments, the sensor system comprises its own internal battery 5. The battery may be recharged by electromagnetic induction, or the system directly powered in this way, rather than the sensor system having connections to external power sources, which require a penetration of the pressure vessel and feedthroughs, this allows charging without compromising the integrity of the pressure vessel. Various sensors may be provided in the pressure vessel. In the example shown, a strain gauge 6 is secured to the pressure vessel end cap 8 to enable pressure readings to be derived by obtaining strain measurements. Other sensors mounted in the pressure vessel may include Hall effect sensors 7a, temperature sensors 7b, or accelerometers 3c. The sensors and circuitry are sealed within the pressure vessel 2 by a pressure transducer end cap 8 and a pressure vessel seal 9.

The end cap may be provided with an external antenna 10 for transmitting to and/or receiving data from an external receiver.

Figure 3:
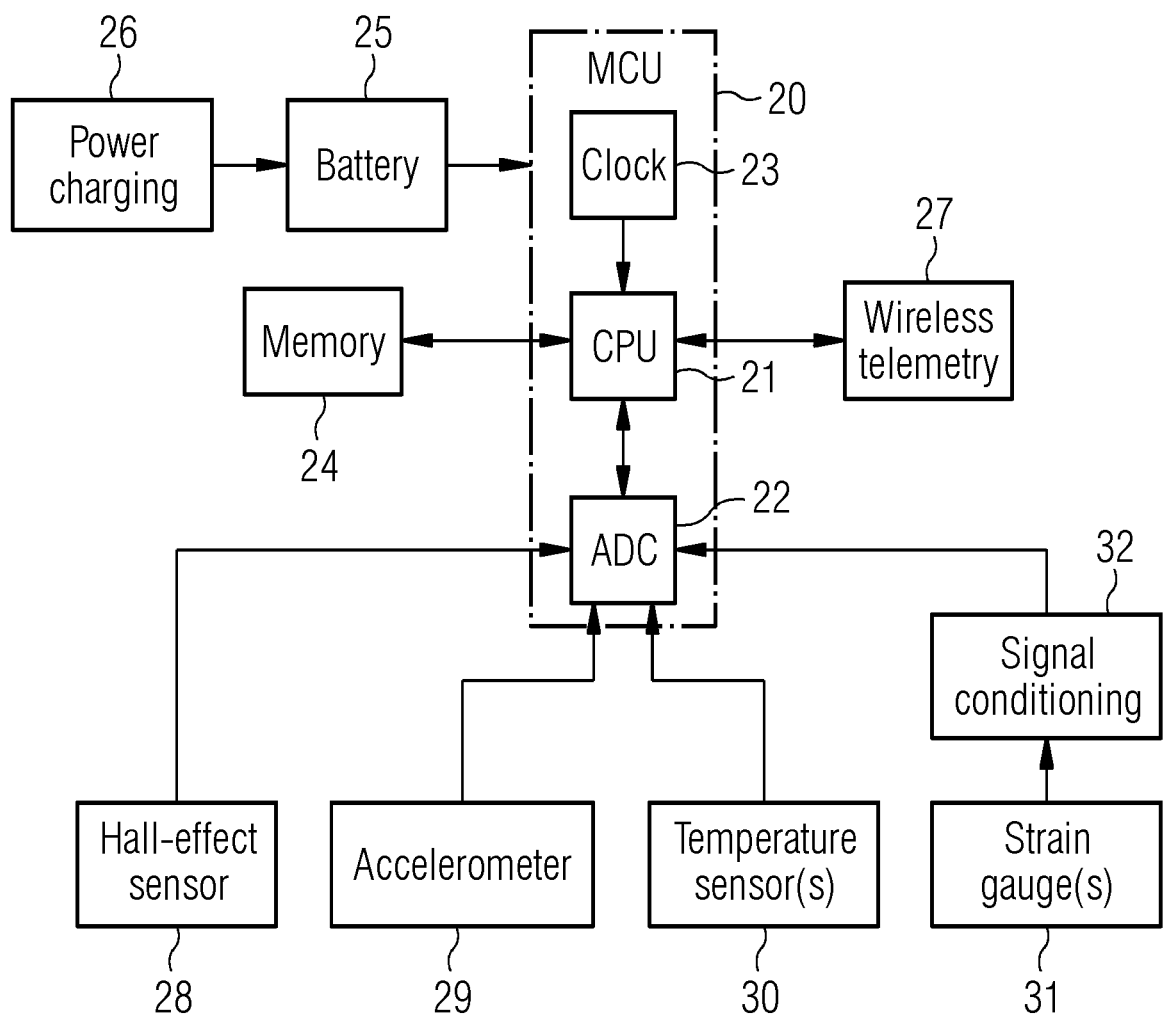
FIG. 3 is a block diagram of elements of the sensor system for a connector of a subsea sensor system according to the present invention.

FIG. 3 is a block diagram showing more detail of the electronic hardware used in the examples of FIGS. 1 and 2 which enable data relating to the mechanical or electrical health of the connector to be obtained, stored and transmitted. The electronics typically comprises a microcontroller unit (MCU) 20 which may include but is not limited to a central processing unit (CPU) 21, peripherals including an analogue to digital converter (ADC) 22 and a clock 23. Memory 24, such as EEPROM or flash memory, inside the MCU 20 and/or as an external discrete package connected to the CPU 21 stores data received from any of the sensors. A battery, or other power source 25, may be re-charged by a power charging mechanism 26, such as energy harvesting by inductive coupling with the connector internal power wires, or an internal connector energy harvesting mechanism which generates electricity through connector manipulation and/or connector mating/de-mating. The electronic components may be chosen to be very low power; drawing as little as nA currents, in order to extend the battery life. To conserve power and maximize battery-life, the MCU 20 is designed to operate in a low-power state ("sleep") for most of its operational life, only "waking up" to take periodic measurements at pre-defined periods or to capture or transfer data when triggered by an event of interest; such as mating/de-mating of the connector, a data transfer prompt or drops of the connector for example. The CPU 21 may also transmit and/or receive data via a wireless telemetry module 27, for example using Bluetooth Low Energy (BLE), or radio frequency identification (RFID) methods. The ADC 22 converts analogue signals received from one or more sensors, such as a Hall effect sensor 28, to digital data and the CPU 21 transfers the digital data to memory 24 for onward transmission via the wireless telemetry module 27 when a data transfer prompt is received by the MCU 20.

The sensors may comprise any combination of, for example, one or more Hall effect sensors 28, for deriving current from sensed data; one or more accelerometers 29, which may be used for prompting the MCU 20 to wake up, deriving mating and de-mating events from sensed data or recording drop impacts; one or more temperature sensors 30 for temperature sensing; and one or more strain gauges 31 for deriving pressure data from sensed strain measurements. The strain gauge(s) 31 may be connected to the MCU 20 via a signal conditioning element 32 to amplify the measured voltage from the strain gauge deflection bridge. Power for the sensors may be provided by the battery 25, but sensor "sleep" states may be controlled by the MCU 20 to further reduce power consumption of the system.

The Hall effect sensor(s) 28 infers the current flowing in a connector wire by measuring the magnetic flux density produced around the wire as a result of current flowing in the conductor(s). This type of sensor may be located in the vicinity of the current carrying conductor to provide sufficient sensitivity to sensing changes in the magnetic field density generated which can then be correlated to electrical current.

Strain gauge(s) 31 may be located on the internal surface(s) of the pressure vessel 2. The strain gauge(s) 31 may be used to determine a differential pressure between the pressure of the dielectric oil shared amongst the connector and hose, and the pressure of the dry atmosphere inside the pressure vessel 2. The effect of this pressure difference results in strains in the pressure vessel geometry which can be measured as voltages by using a strain gauge deflection bridge arrangement and appropriate signal conditioning (amplification) to then directly correlate the pressure of the dielectric oil.

In another embodiment, a magnetometer sensor may be provided in the sensor system 1. The magnetometer sensor is used to detect magnetic flux, thus allowing the embedded system to measure or detect the current flowing through one or more conductors of a connector. The magnetometer sensor is placed in close proximity to the conductor or each of the connectors for which information is required. A magnetometer sensor is more sensitive than a hall-effect sensor, producing more accurate readings that give earlier warning of changes in the connector performance. Another benefit of this more sensitive performance is that it allows a determination of whether a connector has power ON. With this information, an indicator to this effect may be provided, which increases operational safety. Operators are then able to more easily check whether a connector is powered on before disconnecting 'live' pieces of subsea equipment, subsea. Using a magnetometer sensor to detect the earth's magnetic field provides a supplementary mechanism for determining connector orientation. This data may then be used in an event detection algorithm, such as when determining the number of mates and demates.

An example of a status indicator is an LED status indicator, for example in the form of a ring visible from the side and rear of the connector through the use of the LED diffuser which is illuminated via the LEDs. This allows various connector status information to be communicated to an operator, such as connector power ON, connector mate detection, wake/sleep mode transition, data transfer completion etc. To differentiate between different events, different LED colours and power ON/OFF timing/sequencing may be used. The LED diffuser may be dual purpose, for example, illuminating when LEDs are powered ON and acting as a non-conductive window to allow radio waves to be transmitted between the outside and inside of the pressure vessel. This is described and illustrated in more detail below, with respect to FIG. 10. Using radio waves to transmit data from the sensor system means that there is no need to align coils or be in particularly close proximity, which is useful when extracting data via an ROV. Provided that the ROV can get within a few meters of the transmitter, the receiver does not require an ideal alignment relative to the transmitter.

Operators wish to know the hose or connector oil pressure prior to subsea connector deployment, but adding a traditional pressure sensor which penetrates into the hose or connector after the oil filling has been completed means the sensor cannot be removed without compromising the oil pressure in the system. Therefore, if the pressure sensor is to remain installed to maintain the oil pressure, this requires a suitable method of terminating the pressure sensor tailed conductors which protrude from the connector or hose, which is undesirable. In the design of the present invention, one or more strain gauges on the pressure vessel geometry, which deflect in response to the hose or connector oil pressure the other side of the pressure vessel wall, generate a voltage change measured across a resistive strain gauge deflection bridge, which can be correlated to the oil pressure in the hose and connector. Data relating to the oil pressure can then be transmitted wirelessly to an external receiver. This eliminates the need for protruding tailed conductors and a method of termination which is suitable for subsea conditions.

One or more accelerometers 29 may be located on the embedded system to measure accelerations in one or more directions. The MCU 20 is normally in a "sleep" or low power state, from which it wakes at pre-defined intervals by means of an interrupt (a prompt event) generated by an internal MCU timer to capture the readings produced by the various sensors. The accelerometer 29 may also be in a low power mode during normal operation, characterised by lower data rates, but still capable of sensing accelerations and generating interrupt requests to wake-up the MCU 20 in order to prepare for monitoring higher frequency acceleration signatures and determining whether a connector mate or de-mate has occurred. The number of mates and de-mates may be recorded for later use and form the basis for an operator to assess the mechanical usage of a subsea connector. For example, a count of the number of mates may be incremented when a pre-defined acceleration signature representative of a connector mate is registered by the MCU 20 and the count stored in the memory 24. Digital signal processing techniques may be programmed onto the MCU, such as filtering or Fast-Fourier transformation (FFT) to detect particular components of acceleration signatures which are indicative of a connector mate/de-mate. Predefined acceleration signatures and their thresholds may be stored in the MCU program memory. For example, an ROV mate is typically less well-controlled than a diver mate, so the expected signature varies with connector type. Accelerations sensed below a certain threshold, for example accelerations caused by ocean currents during a wake period for a designated length of time may be used to signify to the MCU that it should enter sleep mode again to conserve power.

Using wake-up prompts topside is quite straightforward, such as an accelerometer 'tap-to-wake' which can easily be activated by a person. Waking up the embedded sensor system subsea may be done using a variety of methods. These may include detecting a signal transmitted via an external transmitter, for example over the Bluetooth protocol. Alternatively, an ambient light sensor may be used to wake the system up when subsea. For example, high power lights used on ROVs may illuminate an LED diffuser and raise the ambient light level inside the pressure vessel, in turn waking up the embedded system to prepare for transferring sensor data. Another option is to use near field communication (NFC) or radio frequency identification (RFID) methods, for example involving the application of an external changing magnetic field from an external transmitter to activate a simple transistor switching circuit, in turn pulling a microcontroller pin high or low to wake the embedded system, as another non-intrusive subsea wake up prompt.

One or more temperature sensors 30 may be used to measure the ambient temperature within the pressure vessel 2. This information may be used to give an indication of the condition of the connector. For example, as heat generated by current flowing in the connector conductors (joule heating) causes a rise in ambient internal pressure vessel temperature, then the temperature sensor allows temperature data relating to the connector oil cavity around the conductors to be derived by correlation. Normal operation of the connector generates heat in the surrounding oil filled connector cavity, so monitoring of temperature trends provides a method of detecting faults associated with the connector.

In the embedded sensor system, the sensors 28 to 30 and the signal conditioning block 32 provide inputs to the MCU 20 which includes the ADC function 22, as well as the CPU 21 which executes the necessary instructions to read/write data to and from the memory 24. The MCU also controls the transmission of measurement data. However, as indicated above, in pressurised systems, it is desirable to avoid feedthrough connections where there are significant pressure differentials, so the data received from the sensors 28 to 31 and stored in the memory 24 needs to be exported from the pressure vessel 2 in some other way. A method is to use wireless methods, such as Bluetooth, or RFID. Other protocols suitable for operation with the Internet of Things (IoT) technologies may be used. For IoT operation, each device, whether mechanical or digital is allocated a unique identifier and is able to transfer data across a wider system or network, both subsea and topside without direct human interaction. Other options for wireless transmission are Infrared (IrDA), NFC and Wi-Fi.

The pressure vessel 2, as shown in FIG. 1 needs to be designed to allow wireless transmission of data. For example, a non-conductive section is incorporated into the pressure vessel, such as a glass surface at one end, or a glass or plastic window, or other suitable non-conductive material for the window, or surface. This allows stored data to be transmitted non-intrusively by wireless means though the pressure vessel to an external receiver. This may be for example, a receiver mounted to an ROV. The ROV may bring a receiver to the other side of the non-conductive section and a location mechanism may be used to locate and orient the receiver correctly. There may still be some seawater volume in which the electromagnetic data signals must propagate through, so typically, lower transmission frequencies and shorter distances from within the pressure vessel is advantageous. The frequency used depends upon the transmission method selected, for example, Bluetooth at 2.4 GHz ISM band (Industrial, Scientific and Medical radio bands), but more generally radio frequencies between 3 kHz and 300 GHz may be chosen In some cases, an integrated antenna on the PCB or integrated circuit (IC) in the pressure vessel may not be suitable or available, particularly if lower frequency radio waves are used, requiring a larger antenna, so in such situations, an external antenna 10 may be plated on the exterior of the pressure vessel 2 in order to transmit data to the external receiver. This plating may run behind the pressure vessel seal, acting as a sealing face while also allowing data to be transmitted from the antenna without requiring additional pressure vessel feedthrough connections. Instead of using a feedthrough, such as a wire, to the external antenna, a conductive plating may be used which connects the internal embedded system to the external antenna without adding another sealing boundary, as the pre-existing pressure vessel seal seals on the plating surface, i.e. the plating runs behind the seal.

Figure 4:
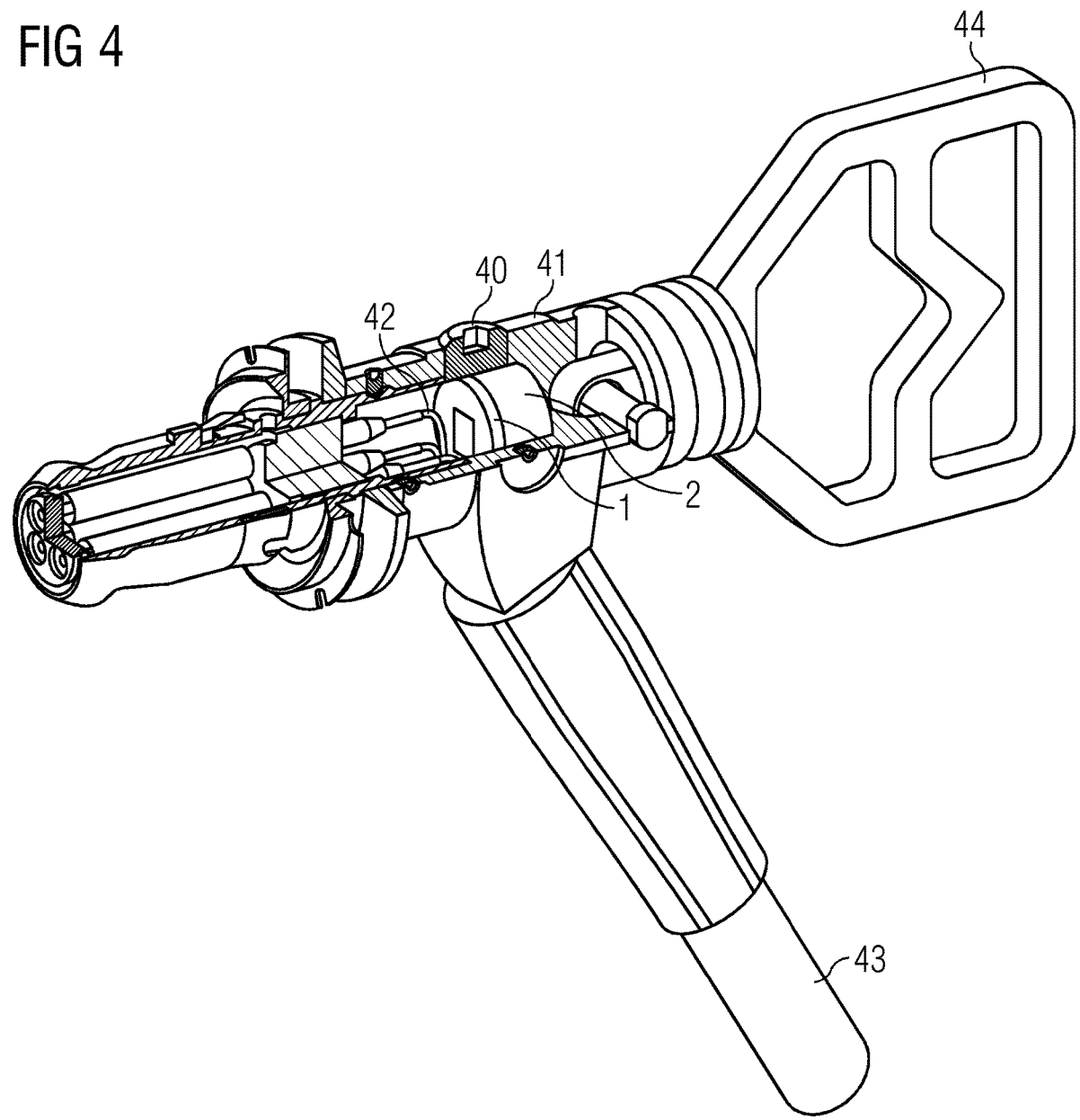
FIG. 4 illustrates an example of one configuration of a connector of a subsea sensor system according to the present invention, with a fully contained embedded sensor system.

Two options for the relative location of the sensor system with the connector body are illustrated in FIGS. 4 to 7. These designs permit acquisition of connector health or usage data by the sensor system 1 and transmission of that data to a receiver outside the connector housing. FIG. 4 illustrates a fully contained embedded sensor system, located entirely within the connector housing 41, in the vicinity of the conductors 42 which transition into the hose 43. The example shown has a handle 44 to allow an ROV to manipulate the connector. A non-conductive window 40, as previously discussed, is located in the connector housing 41 close to the sensor system 1, to address the problem of transferring data through the metallic connector housing 41 to an external receiver. The pressure vessel 2 of the sensor system 1 is provided with an external antenna 10 in this fully contained solution, in the instance that low frequency (long wavelength) radio waves are used as a method of transmitting data.

Figure 5:
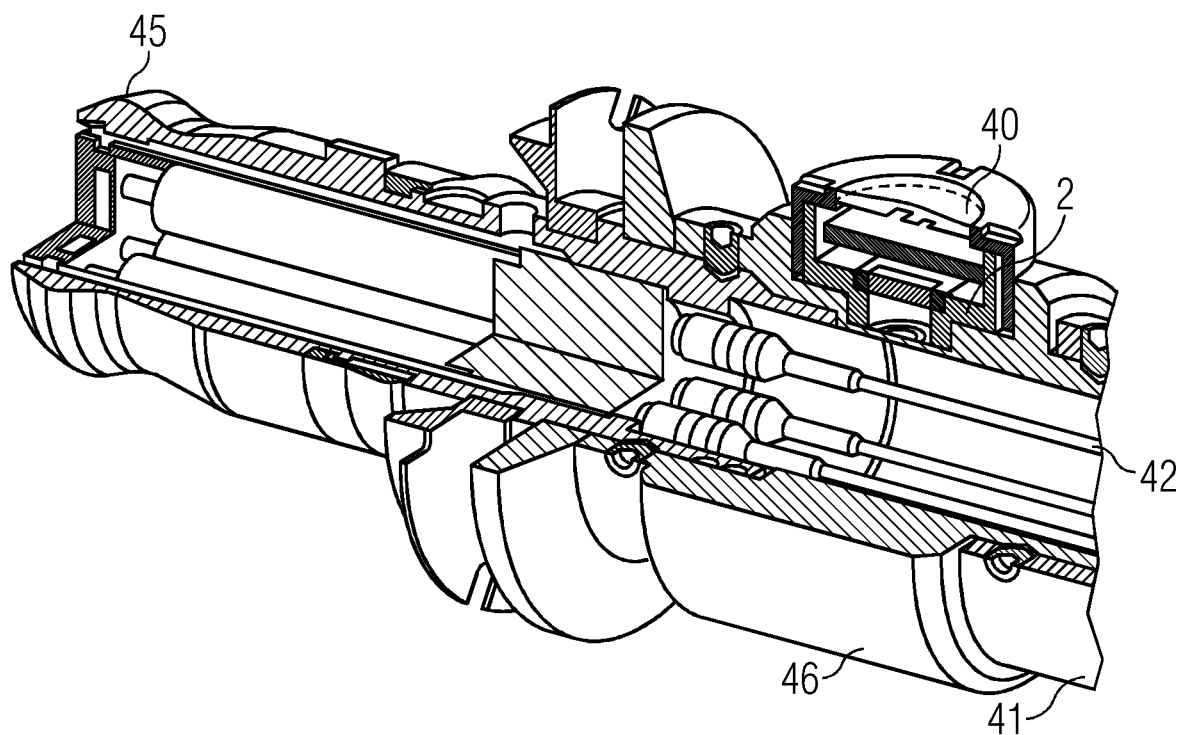
FIG. 5 illustrates part of an example of another configuration of a connector of a sensor system according to the present invention, with a partially contained embedded sensor system.
Figure 6:
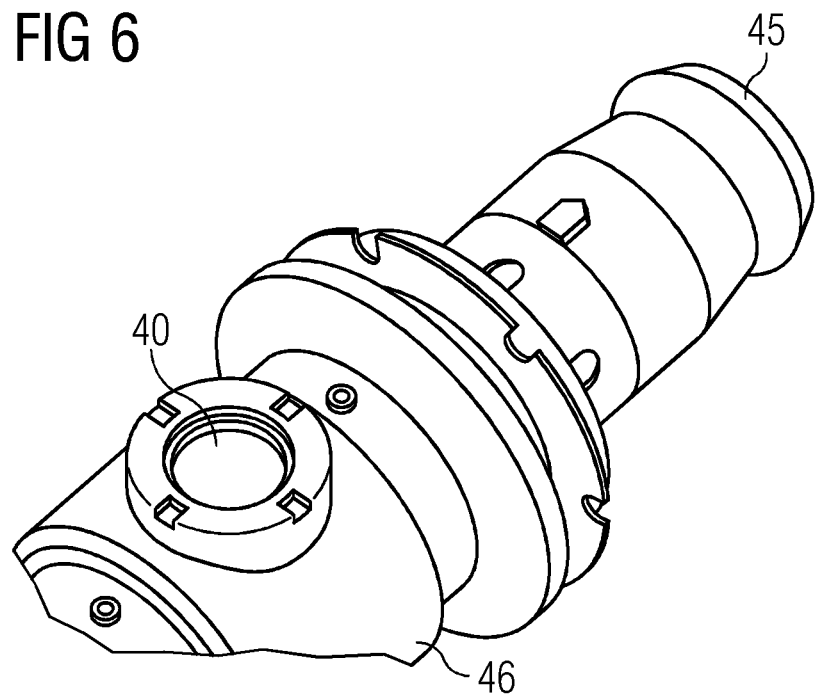
FIG. 6 shows a different view of part of the configuration of FIG. 5.
Figure 7:
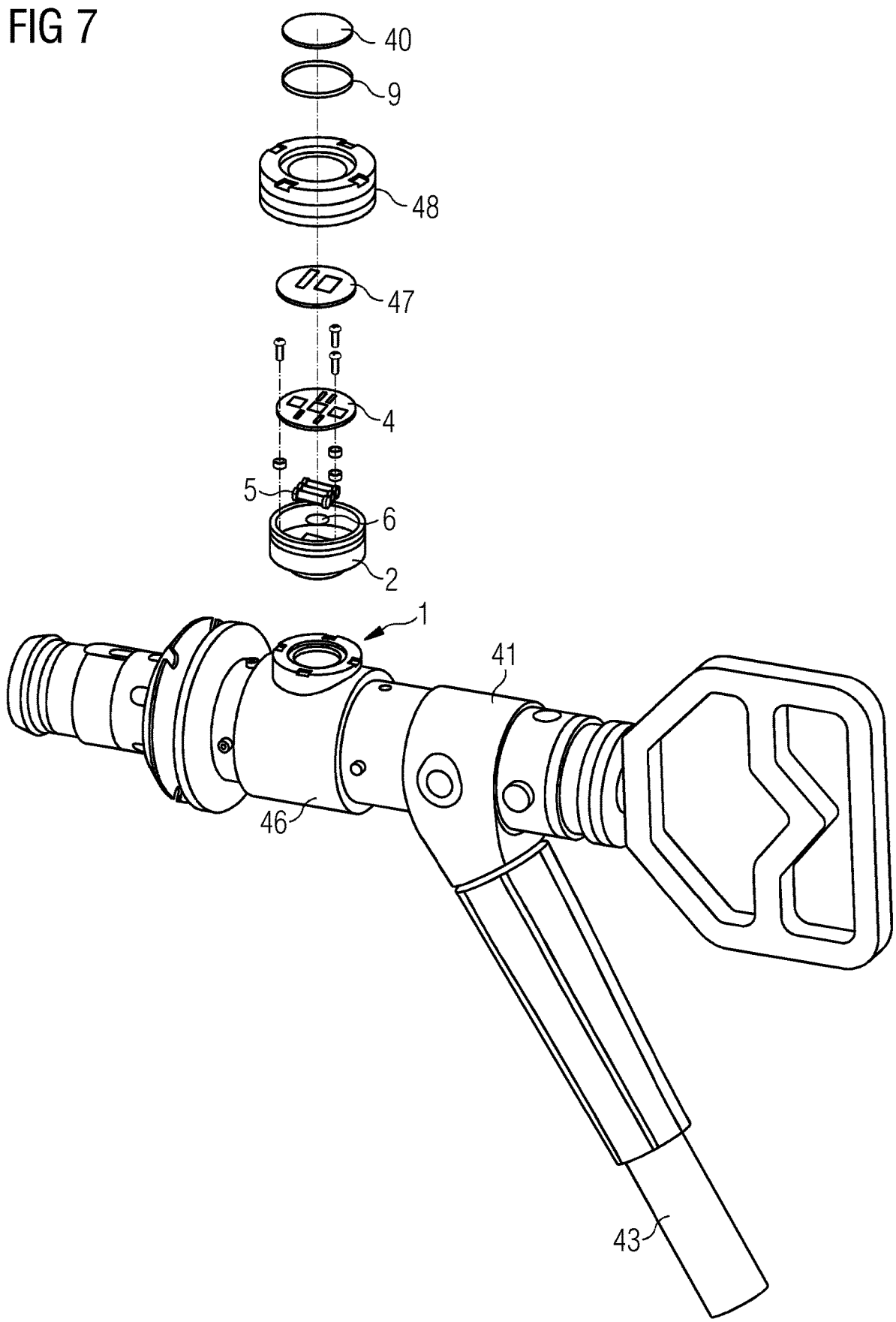
FIG. 7 shows an exploded view of part of the configuration of FIG. 5.

An alternative embodiment, only partially contained in the connector comprises a pressure vessel geometry 2 which penetrates into the connector cavity, as shown in different views in FIGS. 5 to 7. FIG. 5 shows a section view of the connector front end 45 connected to an intermediate modular sensor adaptor 46. Connector conductors 42 traverse from the connector front end 45, through the intermediate sensor adaptor 46 and into the rear of the connector housing 41. On the top face of the intermediate sensor adaptor 46, an opening is formed into which a sensor system pressure vessel 2 is incorporated. This can be seen in an alternative view from above in FIG. 6, with the window 40, which is transparent to electromagnetic waves and visible light. FIG. 7 shows more detail of how the sensor system is constructed, in an exploded view. This takes a similar structure to the example of FIG. 1. A pressure vessel 2 may be mounted into the intermediate sensor adaptor 46. A strain gauge 6 may be mounted on the inside surface of the pressure vessel to create a pressure transducer. The battery 5, PCB 4 and optional display 47 are stacked above the strain gauge, sealed with a retention ring 48, pressure vessel gasket 9 and electromagnetically transparent window 40, for example glass as the outmost element. The display 47 is visible through the glass window in the centre of the retention ring 48 and pressure vessel gasket 9.

In the example of FIG. 7, the sensor system 1 in the pressure vessel 2 may include a simplistic data representation, for example, using light emitting diodes (LEDs), an organic LED (OLED) display, a seven-segment display, or a liquid crystal display (LCD) to provide data visually. This data may then be captured in visual form by a camera on an ROV, or by a diver, when subsea, or by topside personnel, prior to subsea deployment, provided that the non-conductive window 40 in the pressure vessel is also visually transparent, such as a ceramic or glass window, suitably aligned with the display. As visual displays have greater power consumption associated with them, then effective power management strategies, or inductive coupling with connector power lines may be needed to augment the sensor system battery power supply.

Figure 8:
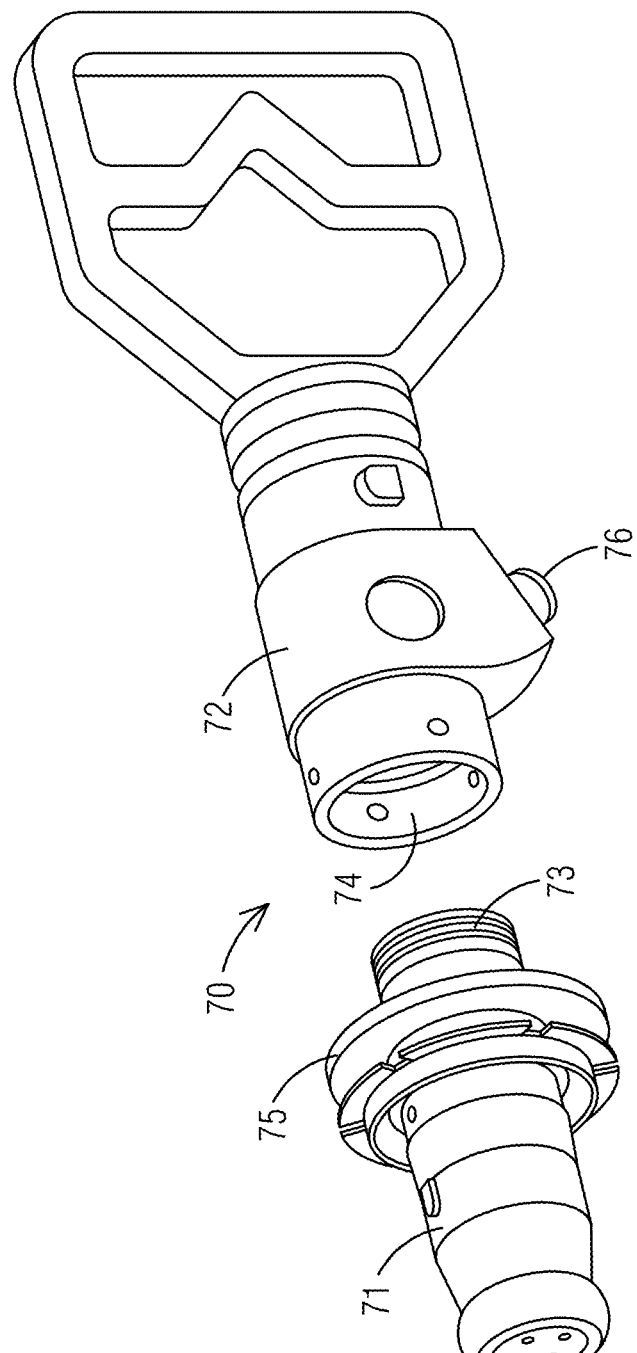
FIG. 8 illustrates examples of a typical connector front end and back end before they are connected.
Figure 9:
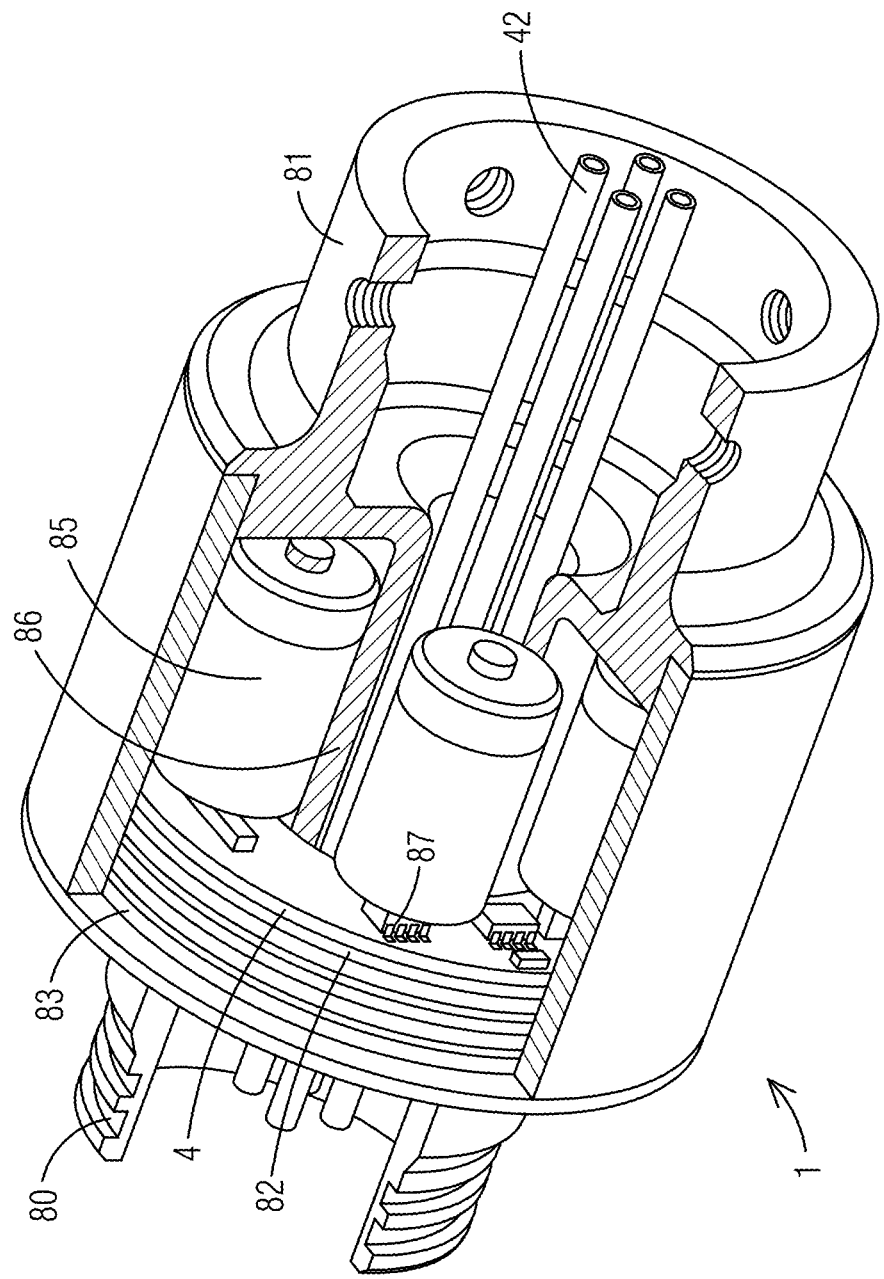
FIG. 9 illustrates a sensor system according to the invention configured to connect between the back end and front end of FIG. 8.
Figure 10:
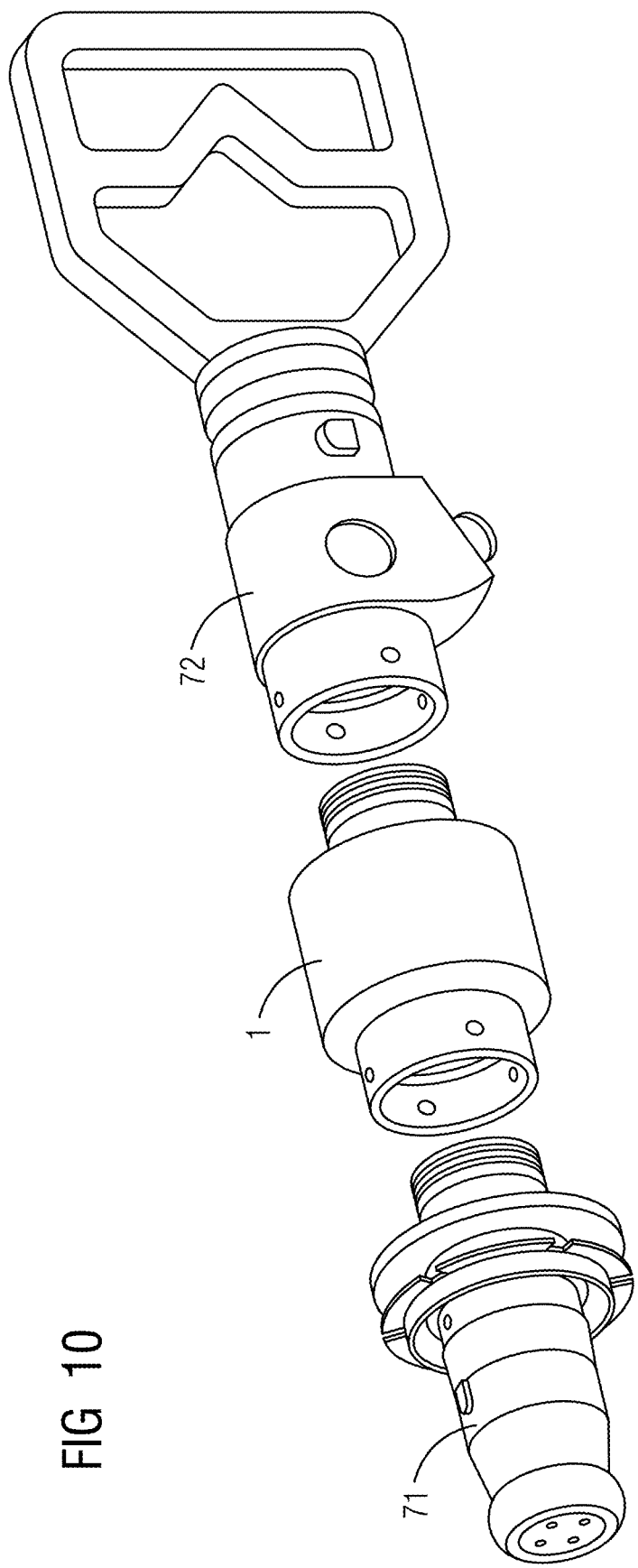
FIG. 10 illustrates the sensor system of FIG. 9 in place between the connector back end and front end; and, FIGS. 11A and 11B show flow diagram of one example of an operational flow diagram of a method for operating a sensor system according to the present invention.

FIG. 8 illustrates a connector 70 comprising a front end 71 and back end 72 just before the back and front end are connected. An interface 73 is provided, by which the front 74 of the back end is joined to the back 75 of the front end 71. FIG. 9 illustrates the independently mountable sensor system 1 of the present invention, which has a corresponding back end interface 80 and front end interface 81. FIG. 10 illustrates how the sensor system 1 connects the back end 72 to the front end 71. An alternative, not shown, is to use the sensor system 1 connected between a hose and the back 76 of a back end 72 of a connector 70. Again, this makes use of the same standard interfaces 81, 80. Furthermore, FIG. 9 illustrates the location of LEDs 82 and electronic components 87 on PCB 4 and LED diffuser 83 and connector conductors 42 emerging from the front end. Batteries 85 are mounted in a 1 atmosphere chamber 86.

Figure 11A:
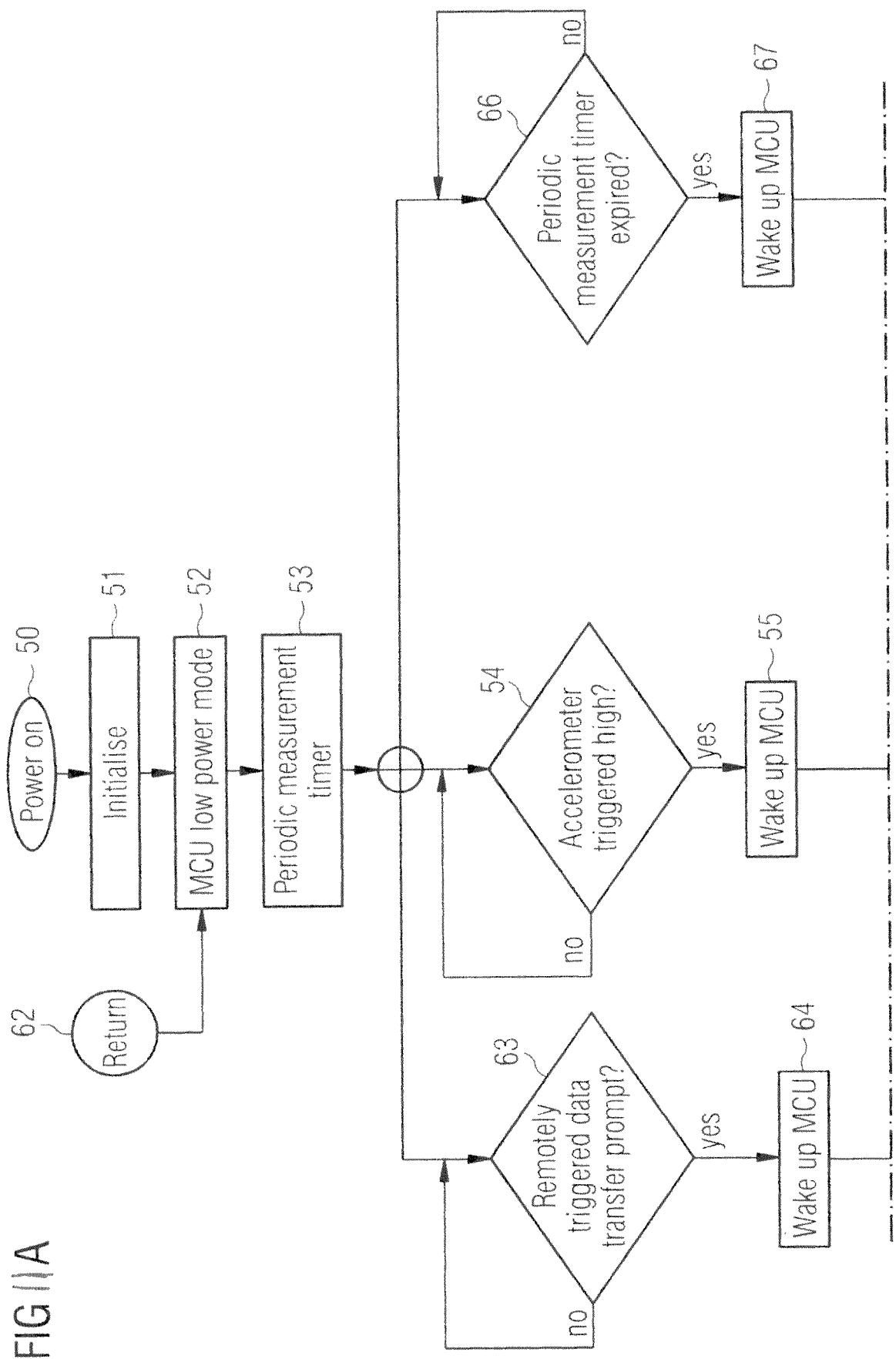

FIGS. 11A and 11B illustrate an example of an operational flow chart that may be used as the basis for operating a fully or partially contained sensor system of the types described above. The operational program comprises a main program routine and three key interrupt service routines (ISRs), each of which interrupt the MCU by pausing the main program routine to perform a required set of instructions when an interrupt is generated, and then allows the MCU to resume the main program routine. The first instruction after powering on the device 50 is to start the MCU initialization sequence 51. After that, the MCU starts its main program routine where it enters into a low power mode 52 and increments a periodic sensor measurement timer 53. The first ISR condition of the accelerometer being triggered high 54 is only satisfied when the accelerometer generates an interrupt to the MCU, most likely from a rising or falling edge accelerometer signal when a connector is manipulated. Until this condition 54 is met by an interrupt generated by the accelerometer, the MCU remains in low power mode. If the accelerometer generates an interrupt to the MCU, then the MCU is woken up 55 and acceleration readings begin to be monitored 56. After a timeout timer has started 57, the MCU may continually assess for whether or not a mate signature has been detected 58 by the MCU polling. If not, then a check is made as to whether the timeout timer has expired 60. If not, the system continues to poll through steps 57, 58, 61. If the timer expires, then the system is returned 61 to the beginning of the normal program routine where it re-enters 62 into the low power mode 52. If the signature detected is deemed to be a mate signature, then the number of mates is counted, and the mate counter is incremented 59 and the data is saved, for example to Flash or EEPROM memory 24. After this the MCU returns 61, 62 to the normal program flow and re-enters a low power mode 52.

A second ISR which governs the transfer of data 63 to an external device, is executed when an interrupt is received from an external device which prompts the MCU to transfer data, for example, from a topside controller or from a signal transmitted from an ROV transceiver held close to the window 40. If the interrupt is generated, the MCU is woken up 64 and the memory 24 is read by the CPU and the data therein is transferred 65 via the wireless telemetry module 27 to the requested destination. Thereafter, the program flow returns 61, 62 to the main program routine and the MCU enters low power mode 52.

The third ISR 66 comprises of controlling the MCU to take periodic measurements from the sensors. Whilst the MCU is operating normally in low power mode 52, the periodic sensor measurement timer 53 is incrementing. Once this timer overflows (expires) an interrupt is generated to prompt the MCU that the timer has expired, the MCU is woken up 67 and periodic sensor measurements are captured 68. The specific sensor measurements to be captured may be pre-set. For example, periodic sensor measurements may be chosen to be current, temperature and pressure measurements. The captured sensor data may then be saved 69 to storage, such as to Flash or EEPROM memory 24. The program flow returns 61, 62 to the beginning of the main program routine, where the MCU re-enters a low power mode 52. Priority of the interrupt service routines may be defined based on individual operators' perception of precedence.

The present invention addresses the problem of capturing, logging and retrieving operational information or data on the usage and/or health of a subsea connector in-situ, without compromising the connector's operability through manual intervention. Increasing the availability of subsea connector applications will be achieved through this technical solution providing a basis for predictive maintenance strategies to be employed. An embedded sensor system according to the present invention, contained within a sealed pressure vessel, at a predetermined, substantially constant pressure, advantageously at or close to topside atmospheric pressure, within a subsea connector, as described may comprise one or more printed circuit boards, populated with the required discrete electronic components. The sensor system performs analogue to digital conversion (ADC) of the required sensor signals and writes the data to a dedicated memory location, which can later be read and then transmitted wirelessly to an external receiver upon registering a data transfer prompt, for example, initiated by a remotely operated vehicle (ROV), diver or topside personnel.

A sensor system of the type described reduces the total cost of ownership of a subsea connector by providing operators with the ability to retrieve quantitative data about their connector's usage and/or health, to enable informed decisions to be made based on predictive maintenance schedules. The data acquired may also provide information on how the connector application is operating (for example, operation of electrical submersible pumps or other such devices subsea). The acquisition of connector health or usage data in a non-intrusive manner is made possible, without disabling the connector and the application it powers. The connector hose pressures may be quantified non-intrusively after oil filling and before subsea deployment which is a desirable feature for the customer.

The self-contained embedded system comprising a low-power MCU, with ADC and memory storage (EEPROM or Flash) provides datalogging functionality and the various sensors have specific functions. For example, the temperature sensor(s) interface with the MCU to allow data relating to the connector health to be stored and the accelerometer sensor in conjunction with carrying out appropriate signal processing in the embedded MCU allows for the counting of the number of connector mates and de-mates carried out, which is a main indicator of connector mechanical usage. The hall-effect sensing element allows the current flowing through the connector to be measured and recorded, which also gives an indication of the electrical usage of the connector. Furthermore, using wireless telemetry (such as RFID, Bluetooth, etc.) allows the data to be transferred to a fly-by ROV, diver or remotely extracted by topside personnel with a receiver, so enabling data to be sent and received without disabling the operability of the connector. The device may use a battery to be self-contained, along with energy harvesting or inductive coupling as a means of re-charging the battery. Locating strain gauge(s) on the internal surface(s) of the pressure vessel coupled with a battery and wireless telemetry capabilities allows oil pressure measurements to be obtained non-intrusively.

A subsea remote condition monitoring sensor system according to the present invention may be provided as an add-on feature for current connector products. An intelligent product, for example with IoT capabilities, allows better monitoring and integration in operational terms with other equipment. This system avoids the need for a complex and expensive marinized data capture and logging system. Marinizing the embedded system electronics so that they can reliably operate under the hydrostatic pressures at 3000 m below sea level would avoid the need for a pressure vessel housing for the embedded system, but makes upgrades and customisation difficult, as compared with using the electronic componentry housed in a pressure vessel as is proposed herein. By avoiding any penetrations (feedthrough connections) within the pressure vessel, using indirect measurements, such as of temperature and current, then extracting data wirelessly, the pressure vessel is made more robust and reliable.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The foregoing examples have been provided merely for the purpose of explanation and are in no way to be construed as limiting of the present invention disclosed herein. While the invention has been described with reference to various embodiments, it is understood that the words, which have been used herein, are words of description and illustration, rather than words of limitation. Further, although the invention has been described herein with reference to particular means, materials, and embodiments, the invention is not intended to be limited to the particulars disclosed herein; rather, the invention extends to all functionally equivalent structures, methods and uses, such as are within the scope of the appended claims. Those skilled in the art, having the benefit of the teachings of this specification, may affect numerous modifications thereto and changes may be made without departing from the scope of the invention in its aspects.

It should be noted that the term "comprising" does not exclude other elements or steps and "a" or "an" does not exclude a plurality. Elements described in association with different embodiments may be combined. It should also be noted that reference signs in the claims should not be construed as limiting the scope of the claims. Although the invention is illustrated and described in detail by the embodiments, the invention is not limited by the examples disclosed, and other variations can be derived therefrom by a person skilled in the art without departing from the scope of the invention.

The invention claimed is:

1. An independently mountable sensor system for a wet-mateable subsea connector or a dry-mateable subsea connector comprising at least one of a receptacle connector body or a plug connector body; the sensor system comprising:
    a pressure vessel;
    one or more sensors, a power source, a transmitter, a processor unit and a memory within the pressure vessel,
    wherein the pressure inside the pressure vessel is maintained at a predetermined pressure;
    wherein the sensor system further comprises an antenna;
    wherein the pressure vessel comprises an electromagnetically transparent section to permit electromagnetic waves to pass between the sensor system and an external receiver;
    wherein the sensor system is configured to be mounted between a back end and a front end of the receptacle connector body, or between a back end and a front end of the plug connector body; or configured to be mounted to the connector body back end.
2. The sensor system according to claim 1,
    wherein the sensor system is configured to be mounted to an opening in the housing between the back end and the front end of the plug connector body, or receptacle connector body.
3. The sensor system according to claim 1,
    wherein the predetermined pressure is a substantially constant pressure, and wherein the pressure within the pressure vessel is within the range of 940 mBar (94000 Pa) to 1050 mBar (105000 Pa).
4. The sensor system according to claim 1,
    wherein the sensor system further comprises a receiver.
5. The sensor system according to claim 1,
    wherein the sensor system further comprises a control device.
6. The sensor system according to claim 1,
    wherein the pressure vessel comprises a metal housing into which the electromagnetically transparent section is integrated.
7. The sensor system according to claim 1,
    wherein the electromagnetically transparent section comprises glass, ceramic or plastic.
8. The sensor system according to claim 1,
    wherein the one or more sensors comprise at least one of a strain gauge, an accelerometer, a temperature sensor and a Hall effect sensor, or a magnetometer sensor.
9. The sensor system according to claim 8,
    wherein the strain gauge is mounted to an internal surface of the pressure vessel, an outer surface of which is in contact with an oil filled cavity of the connector or hose.
10. The sensor system according to claim 8, further comprising:
    a signal conditioning module to amplify strain gauge measurements.
11. The sensor system according to claim 1,
    wherein the power source comprises a battery.
12. The sensor system according to claim 11,
    wherein an electromagnetic induction, or energy harvesting charger is provided in the pressure vessel to charge the battery.
13. The sensor system according to claim 1, further comprising:
    an external antenna mounted to an outer surface of the pressure vessel.
14. The sensor system according to claim 13,
    wherein the external receiver comprises a camera to capture an image of the sensor system display.
15. The sensor system according to claim 1, further comprising:
    a display within the pressure vessel.
16. The sensor system according to claim 1,
    wherein the transmitter comprises a wireless transmitter transmitting in a frequency range of 3 kHz to 300 GHz.
17. A wet-mateable subsea connector or a dry mateable subsea connector, the connector comprising:
    a housing body,
    a front end and back end, and
    a sensor system according to claim 1 mounted within the housing body of the connector, or mounted to an opening in the housing body of the connector, between the back end and the front end.
18. The subsea connector according to claim 17,
    wherein the sensor system is mounted between the connector back end and a hose connection.
19. The subsea connector according to claim 17,
    wherein the connector housing comprises a location mechanism to guide an external receiver to the electromagnetically transparent section.
20. A method of operating a sensor system according to claim 1, the method comprising:
    operating the sensor system in a sleep or low power mode until a prompt occurs;
    on occurrence of the prompt, sending a wake-up signal to the processor unit of the sensor system;
    obtaining one or more predetermined measurements in response to a specific prompt detected; and
    saving the one or more measurements to the memory; or extracting one or more saved measurements from the memory and transmitting the measurements by means of electromagnetic waves through the electromagnetically transparent section to an external receiver.

21. The method according to claim 20,
wherein the prompt event comprises detecting, in an accelerometer in the sensor system, an acceleration signature representing a mate or demate.

22. The method according to claim 20,
wherein the prompt event comprises detecting a request from an external receiver to transfer to that receiver, stored data from the memory.

23. The method according to claim 20,
wherein the prompt event comprises expiry of a timer, indicating that one or more periodic measurements are required.

24. The sensor system according to claim 4, wherein the transmitter and the receiver are combined in a transceiver unit.

25. The sensor system according to claim 5, wherein the control device comprises a microcontroller unit.

* * * * *